(12) United States Patent
Miks

(10) Patent No.: US 6,798,046 B1
(45) Date of Patent: Sep. 28, 2004

(54) SEMICONDUCTOR PACKAGE INCLUDING RING STRUCTURE CONNECTED TO LEADS WITH VERTICALLY DOWNSET INNER ENDS

(75) Inventor: Jeffrey Alan Miks, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 10 days.

(21) Appl. No.: 10/054,124

(22) Filed: Jan. 22, 2002

(51) Int. Cl.[7] .......................... H01L 23/48; H01L 23/28
(52) U.S. Cl. ................. 257/666; 257/669; 257/698; 257/670; 257/671; 257/672; 257/674; 257/696; 257/691; 257/784; 257/786; 257/675; 257/676; 257/712
(58) Field of Search ..................... 257/666, 674, 257/669–672, 690–693, 696, 698, 784, 786, 787, 675, 676, 712, 713

(56) References Cited

U.S. PATENT DOCUMENTS

| | | | |
|---|---|---|---|
| 3,838,984 A | 10/1974 | Crane et al. | |
| 4,054,238 A | 10/1977 | Lloyd et al. | |
| 4,530,152 A | 7/1985 | Roche et al. | |
| 4,707,724 A | 11/1987 | Suzuki et al. | |
| 4,756,080 A | 7/1988 | Thorp, Jr. et al. | |
| 4,812,896 A | 3/1989 | Rothgery et al. | |
| 5,041,902 A | 8/1991 | McShane | |
| 5,157,480 A | 10/1992 | McShane et al. | |
| 5,168,368 A | * 12/1992 | Gow et al. | 257/666 |
| 5,172,213 A | 12/1992 | Zimmerman | |
| 5,172,214 A | 12/1992 | Casto | |
| 5,200,362 A | 4/1993 | Lin et al. | |
| 5,200,809 A | 4/1993 | Kwon | |
| 5,214,845 A | 6/1993 | King et al. | |
| 5,216,278 A | 6/1993 | Lin et al. | |
| 5,221,642 A | 6/1993 | Burns | |
| 5,258,094 A | 11/1993 | Furui et al. | |
| 5,273,938 A | 12/1993 | Lin et al. | |
| 5,277,972 A | 1/1994 | Sakumoto et al. | |
| 5,278,446 A | 1/1994 | Nagaraj et al. | |
| 5,279,029 A | 1/1994 | Burns | |
| 5,332,864 A | 7/1994 | Liang et al. | |
| 5,336,931 A | 8/1994 | Juskey et al. | |
| 5,343,076 A | 8/1994 | Katayama et al. | |
| 5,365,106 A | * 11/1994 | Watanabe | 257/669 |
| 5,406,124 A | 4/1995 | Morita et al. | |
| 5,424,576 A | 6/1995 | Djennas et al. | |
| 5,435,057 A | 7/1995 | Bindra et al. | |
| 5,474,958 A | 12/1995 | Djennas et al. | |
| 5,521,429 A | 5/1996 | Aono et al. | |
| 5,543,657 A | * 8/1996 | Diffenderfer et al. | 257/666 |
| 5,604,376 A | 2/1997 | Hamburgen et al. | |

(List continued on next page.)

FOREIGN PATENT DOCUMENTS

| | | |
|---|---|---|
| DE | 19734794 A1 | 8/1997 |
| EP | 0794572 A2 | 10/1997 |
| JP | 5745959 | 3/1982 |

(List continued on next page.)

Primary Examiner—Alexander Oscar Williams
(74) Attorney, Agent, or Firm—Stetina Brunda Garred & Brucker

(57) ABSTRACT

A semiconductor package includes a chip mounting pad having a peripheral edge. The package further includes a semiconductor chip attached to the chip mounting pad. The package further includes a plurality of leads. Each lead includes an inner end and an opposing distal end. Each inner end is disposed adjacent the peripheral edge in spaced relation thereto and vertically downset with respect to each respective distal end. The package further includes at least one isolated ring structure disposed along the peripheral edge between the peripheral edge and the inner ends of the leads in spaced relation thereto. The ring structure is electrically connected to the semiconductor chip and an inner end of at least one of the leads.

27 Claims, 4 Drawing Sheets

U.S. PATENT DOCUMENTS

| | | | |
|---|---|---|---|
| 5,608,267 A | 3/1997 | Mahulikar et al. | |
| 5,639,990 A | 6/1997 | Nishihara et al. | |
| 5,640,047 A | 6/1997 | Nakashima | |
| 5,641,997 A | 6/1997 | Ohta et al. | |
| 5,646,831 A | 7/1997 | Manteghi | |
| 5,650,663 A | 7/1997 | Parthasaranthi | |
| 5,683,806 A | 11/1997 | Sakumoto et al. | |
| 5,696,666 A | 12/1997 | Miles et al. | |
| 5,701,034 A | 12/1997 | Marrs | |
| 5,710,064 A | 1/1998 | Song et al. | |
| 5,723,899 A * | 3/1998 | Shin | 257/666 |
| 5,736,432 A | 4/1998 | Mackessy | |
| 5,776,798 A | 7/1998 | Quan et al. | |
| 5,783,861 A | 7/1998 | Son | |
| 5,835,988 A | 11/1998 | Ishii | |
| 5,859,471 A | 1/1999 | Kuraishi et al. | |
| 5,866,939 A | 2/1999 | Shin et al. | |
| 5,877,043 A | 3/1999 | Alcoe et al. | |
| 5,894,108 A | 4/1999 | Mostafazadeh et al. | |
| 5,977,613 A | 11/1999 | Takata et al. | |
| 5,977,630 A | 11/1999 | Woodworth et al. | |
| 5,981,314 A | 11/1999 | Glenn et al. | |
| 5,986,885 A | 11/1999 | Wyland | |
| 6,001,671 A | 12/1999 | Fjelstad | |
| 6,025,640 A | 2/2000 | Yagi et al. | |
| 6,072,228 A | 6/2000 | Hinkle et al. | |
| RE36,907 E * | 10/2000 | Templeton, Jr. et al. | 257/666 |
| 6,130,115 A | 10/2000 | Okumura et al. | |
| 6,130,473 A | 10/2000 | Mostafazadeh et al. | |
| 6,140,154 A | 10/2000 | Hinkle et al. | |
| 6,143,981 A | 11/2000 | Glenn | |
| 6,198,171 B1 | 3/2001 | Huang et al. | |
| 6,225,146 B1 | 5/2001 | Yamaguchi et al. | |
| 6,229,200 B1 | 5/2001 | Mclellan et al. | |
| 6,242,281 B1 | 6/2001 | Mclellan et al. | |
| 6,281,568 B1 | 8/2001 | Glenn et al. | |
| 6,285,075 B1 * | 9/2001 | Combs et al. | 257/675 |
| 6,294,100 B1 | 9/2001 | Fan et al. | |
| 2002/0024122 A1 * | 2/2002 | Jung et al. | 257/666 |
| 2002/0140061 A1 * | 10/2002 | Lee | 257/666 |

FOREIGN PATENT DOCUMENTS

| | | |
|---|---|---|
| JP | 59227143 | 12/1984 |
| JP | 60195957 | 10/1985 |
| JP | 6139555 | 2/1986 |
| JP | 629639 | 1/1987 |
| JP | 63205935 | 8/1988 |
| JP | 63233555 | 9/1988 |
| JP | 1106456 | 4/1989 |
| JP | 692076 | 4/1994 |
| JP | 7312405 | 11/1995 |
| JP | 8125066 | 5/1996 |
| JP | 8306853 | 11/1996 |
| JP | 98205 | 1/1997 |
| JP | 98206 | 1/1997 |
| JP | 98207 | 1/1997 |
| JP | 992775 | 4/1997 |
| JP | 9-293822 | * 11/1997 |
| JP | 10-022447 | * 1/1998 |
| KR | 941979 | 1/1994 |
| KR | 9772358 | 11/1997 |

* cited by examiner

SEMICONDUCTOR PACKAGE INCLUDING RING STRUCTURE CONNECTED TO LEADS WITH VERTICALLY DOWNSET INNER ENDS

CROSS-REFERENCE TO RELATED APPLICATIONS (Not Applicable)

STATEMENT RE: FEDERALLY SPONSORED RESEARCH/DEVELOPMENT (Not Applicable)

BACKGROUND OF THE INVENTION

1. Field of the Invention

The present invention relates generally to semiconductor packages, and more particularly to a semiconductor package which includes leads with vertically downset inner ends.

2. Description of the Related Art

The current trend in the electronics industry is to provide electronic appliances which are multifunctional, compact, and capable of achieving high performance levels. In view of this trend, a requirement has arisen that the semiconductor packages which are used in such electronic appliances be made in a "chip size". These chip-size packages are often referred to as a chip scale package or CSP. These chip-sized small semiconductor packages are usable in portable products such as cellular phones and PDA's which require high levels of reliability, electrical efficiency, and a small or compact size of minimal weight.

One type of currently manufactured CSP is a very small semiconductor package including a lead frame. This particular type of semiconductor package is constructed in a manner wherein a plurality of input/output signal lands (e.g. from four to one hundred signal lands) are formed at the edge of the bottom surface of the package. This package is electrically connected to a printed circuit board by soldering the lands on the bottom surface of the package. This configuration is in contrast to conventional lead frame packages which include, as an alternative to these signal lands, leads which project outwardly from the package and are formed by various trimming/forming techniques. In addition to including the signal lands formed at the periphery of the bottom surface thereof, these semiconductor packages also include a chip mounting pad, the bottom surface of which is exposed for purposes of maximizing an emission rate of heat generated by a semiconductor chip mounted thereto.

Internal to such semiconductor package is a semiconductor chip with a multitude of input/output pads. Such pads are in turn connected to leads which terminate at the signal lands. An overall limitation of the semiconductor chip design as well as the semiconductor package has been the electrical connections and configurations utilized to satisfy the required electrical inputs and outputs to and from the input/output pads. In addition, though the above-described semiconductor packages provide the small size required by the electronic appliances discussed above, they possess certain deficiencies which detract from their overall utility. One such deficiency is insufficient bonding strength between the lead frame and the remainder of the semiconductor package. The lack of adequate bonding strength makes the semiconductor package vulnerable to failure attributable to the creation of electrical discontinuities and/or the dislodging of one or more of the signal lands of the lead frame from the remainder of the semiconductor package. Accordingly, there is a need in the art for an improved semiconductor package design.

BRIEF SUMMARY OF THE INVENTION

In accordance with an aspect of the present invention, there is provided a semiconductor package which includes a chip mounting pad having a peripheral edge. The package further includes a semiconductor chip attached to the chip mounting pad. The package further includes a plurality of leads. Each lead includes an inner end and an opposing distal end. Each inner end is disposed adjacent the peripheral edge in spaced relation thereto and vertically downset with respect to each respective distal end. The package further includes at least one isolated ring structure disposed along the peripheral edge between the peripheral edge and the inner ends of the leads in spaced relation thereto. The ring structure is electrically connected to the semiconductor chip and an inner end of at least one of the leads.

Advantageously, the vertically downset nature of the inner ends of the leads (i.e., the inner ends being offset from the distal ends) tend to enhance the bonding strength of the leads with respect the overall semiconductor package. In this regard, the inner ends being vertically downset or offset enables encapsulation of the inner ends with a sealing part for securing the same internally within the semiconductor package. As such, this enhanced bonding strength tends to substantially eliminate occurrences of delamination between such sealing part and the remainder of the lead frame, such as the inadvertent dislodging of the distal ends (i.e., signal lands) from the sealing part thereby maintaining the overall integrity of the semiconductor package.

According to respective embodiments, each inner end is vertically downset with respect to each respective distal end a distance approximately equal to a thickness of the leads. The semiconductor chip includes a chip top surface and the inner ends each include an inner end top surface, and the inner end top surfaces are aligned with the chip top surface. The ring structure includes a ring top surface and the inner ends each include an inner end top surface, and the inner end top surfaces are aligned with the ring top surface. Each inner end is vertically downset with respect to each respective distal end via a die press operation. The leads each further include a lead transition section disposed between the respective inner and distal ends. The lead transition sections are angularly disposed with respect to the distal ends. The semiconductor package is contemplated to further include a sealing part which encapsulates at least the inner ends of the leads.

The present invention is best understood by reference to the following detailed description when read in conjunction with the accompanying drawings.

BRIEF DESCRIPTION OF THE DRAWINGS

These, as well as other features of the present invention, will become more apparent upon reference to the accompanying drawings wherein.

Common reference numerals are used throughout the drawings and detailed description to indicate like elements.

DETAILED DESCRIPTION OF THE INVENTION

Figure 1:
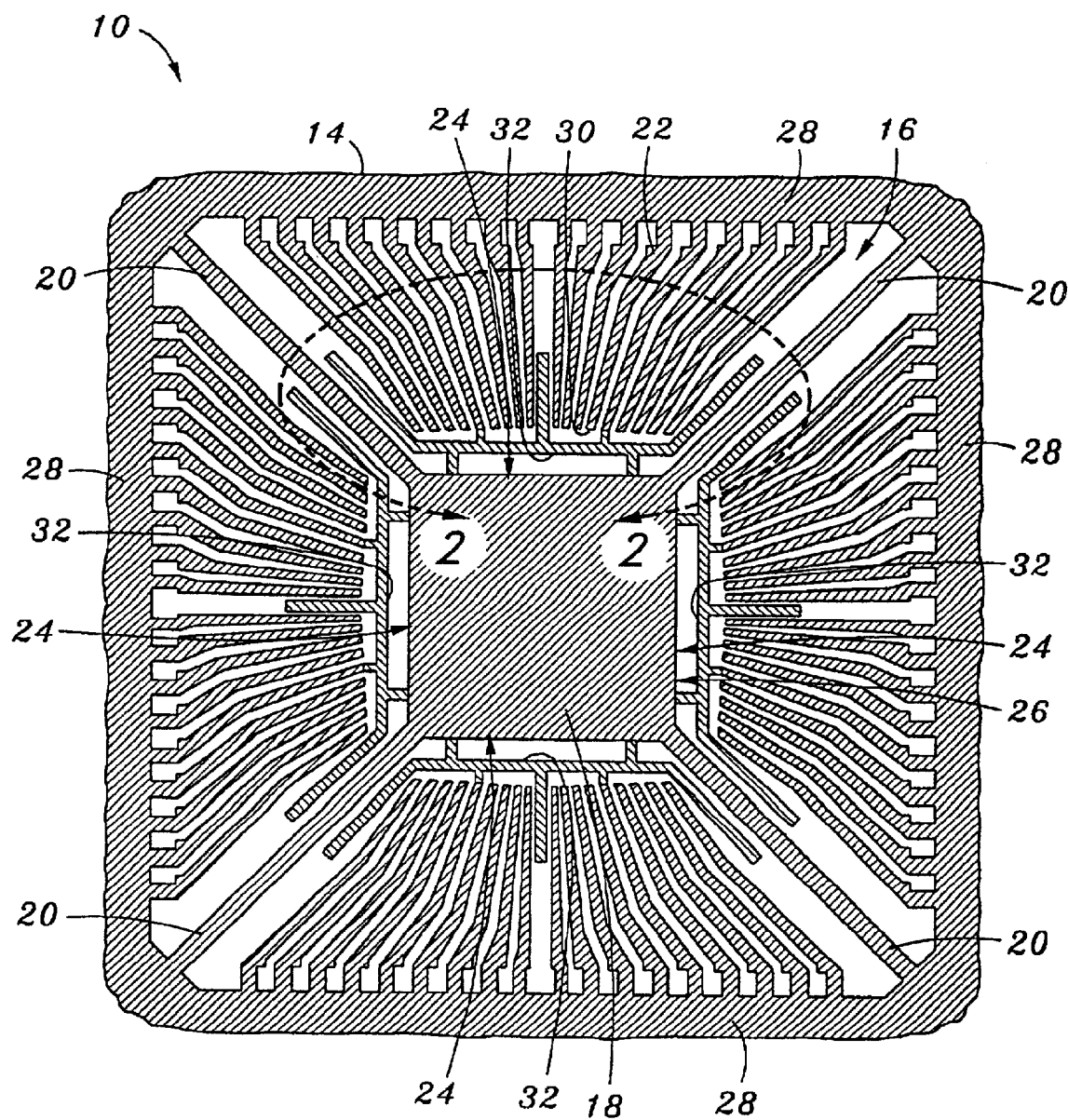
FIG. 1 is a top plan view of a lead frame including a chip mounting pad, ring structures and leads of a semiconductor package constructed in accordance with an aspect of the present invention.

Referring now to the drawings wherein the showings are for purposes of illustrating preferred embodiments of the present invention only, and not for purposes of limiting the same, FIGS. 1–8 illustrate semiconductor packages and methods of fabricating the same according to aspects of the present invention.

Lead frames for semiconductor packages are typically manufactured by mechanically stamping or chemically etching a continuous metal strip. The lead frame serves as a lead connecting a semiconductor chip to an external circuit such as a printed circuit board. The lead frame further serves as a frame for fixing the semiconductor package to the printed circuit board while providing an electrical connection between the printed circuit board and the semiconductor chip.

Figure 6:
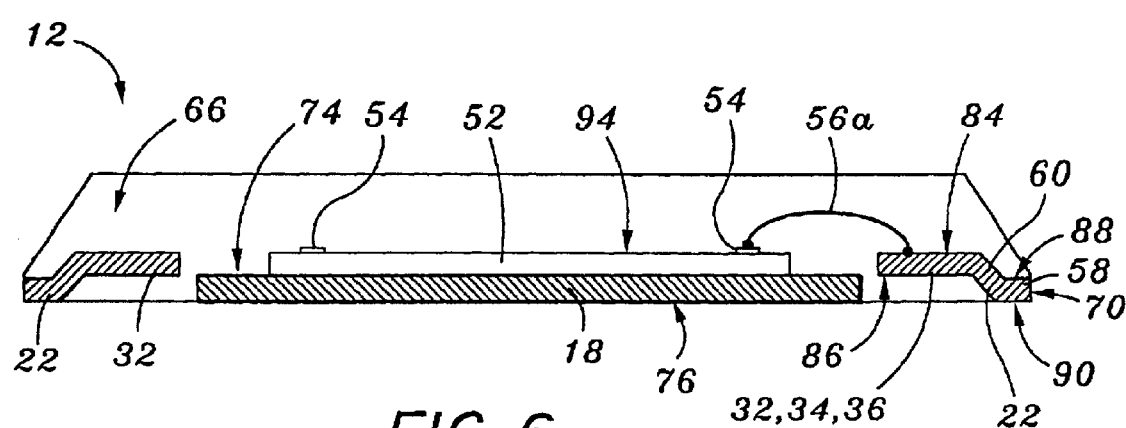
FIG. 6 is a cross sectional view of a completed semiconductor package as seen along axis 6—6 of FIG. 4.

According to an aspect of the present invention, a lead frame 10 is initially provided in a method of fabricating a semiconductor package 12 (as shown in FIG. 6). FIG. 1 is a top plan view of the lead frame 10. The lead frame 10 includes a frame 14 which is a substantially flat or planar plate defining a centrally located space 16. Disposed within the space 16 is a chip mounting pad 18 of the lead frame 10. The chip mounting pad 18 is a substantially square plate which is connected to the frame 14 by a plurality of tie bars 20. Four (4) tie bars 20 are used to connect the chip mounting pad 18 to the frame 14, with the tie bars 20 extending from respective ones of the four corner regions defined by the chip mounting pad 18. The tie bars 20 facilitate the stable support of the chip mounting pad 18 inside of the frame 14, and more particularly within the space 16 defined thereby.

The lead frame 10 further includes a plurality of leads 22 which extend from the frame 14 into the space 16 toward the chip mounting pad 18. A total of seventy-two leads 22 are included in the lead frame 10, with the leads 22 being segregated into four sets of eighteen, and each set of eighteen being disposed in spaced relation to a respective one of the four peripheral edge segments 24 of a peripheral edge 26 defined by the chip mounting pad 18. The leads 22 are each connected to and extend angularly from dambars 28. A total of four dambars 28 are shown in lead frame 10, with each set of eighteen leads 22 extending from a respective dambar 28 and terminating at an inner end 30. Thus, the leads 22 are supported in a stable manner in the space 16 defined by the frame 14 by the dambars 28.

Those of ordinary skill in the art will recognize that the posit on and path of the leads 22 may be varied, and that the leads 22 can be suitably designed according to the number and position of input/output paths desired in the semiconductor package 12. Additionally, though the lead frame 10 is shown as a square configuration, it may alternatively be rectangularly configured. Similarly, though the chip mounting pad 18 is shown as being generally square, the same may also be provided in a generally rectangular configuration. Further, though the leads 22 are shown as being formed in four separate sets around the peripheral edge 26 of the chip mounting pad 18, the leads 22 may also be provided in only two sets extending along and in spaced relation to respective ones of only two of the peripheral edge segments 24 of the chip mounting pad 18. Still further, the chip mounting pad 18 may be connected to the frame 14 through the use of only two tie bars 20 as opposed to the four tie bars 20 as shown.

The lead frame 10 further includes at least one isolated ring structure 32. In the embodiment shown, four ring structures 32 are disposed along respective ones of the four peripheral edge segments 24 of the chip mounting pad 18 between the peripheral edge 26 and the inner ends 30 of the leads 33 in spaced relation thereto. In this regard, the ring structures 32 collectively form a "ring" about the chip mounting pad 18.

Figure 2:
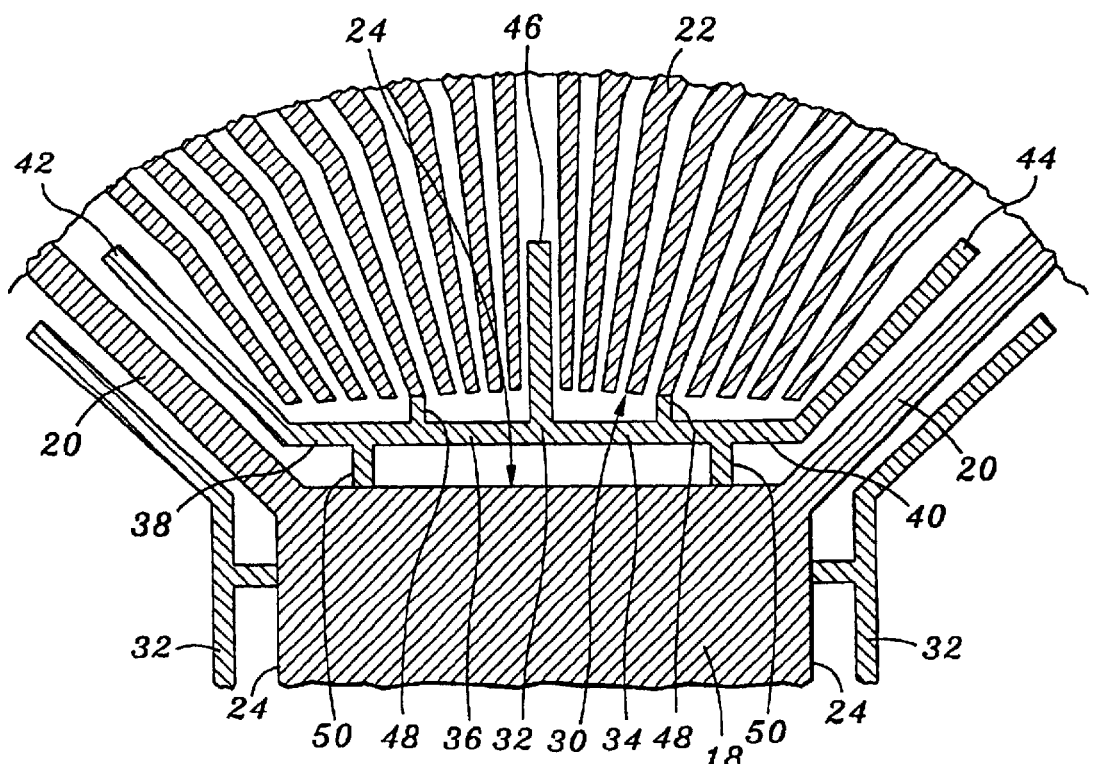
FIG. 2 is an enlargement of the encircled region of the lead frame as shown in FIG. 1.

Referring additionally to FIG. 2 there is depicted an enlargement of the encircled region of the lead frame 10 as shown in FIG. 1. Each ring structure 32 includes a main body portion 34 which is disposed along a respective peripheral edge segment 24. The main body portion 34 includes an intermediate section 36 which is bounded by opposing end sections 38, 40. The main body portion 34 is disposed between the inner ends 30 of the leads 22 and the peripheral edge segments 24. With the exception of temporary connecting bars 48 described below, the main body portion 34 is disposed in spaced relation to inner end surfaces 96 of the inner ends 30 of the leads 22 and the peripheral edge segments 24 (as additionally depicted in the completed semiconductor package 12 of FIG. 5, as seen respectively along axis 5—5 of the FIG. 4).

The ring structure 32 further includes at least one stub portion, such as first, second and third stub portions 42, 44, 46. Additional or fewer stub portions may be included. The first and second stub portions 42, 44 extend distally respectively from the end sections 38, 40. The first and second stub portions 42, 44 may angularly extend from the main body portion 34. Each of the first and second stub portions 42, 44 extend between a given tie bar 20 and an adjoining lead 22. The third stub portion 46 extends laterally from the intermediate section 36 away from the peripheral edge segment 24 along and between a pair of the leads 22.

Two pairs of temporary connecting bars 48, 50 are utilized to support the ring structure 32 within the frame 14 and to maintain the ring structure 32 in fixed relation to the chip mounting pad 18 and the leads 22 during fabrication of the semiconductor package 12. In the embodiment shown, two temporary connecting bars 48 extend between selected ones of the leads 22 (specifically leads 22a) and the intermediate section 36, and two temporary connecting bars 50 extend between the intermediate section 36 and the adjacent peripheral edge segment 24.

It is contemplated that additional or fewer temporary connecting bars 48, 50 may be utilized to connect the ring structure 32 to the frame 14. For example, though not shown, connecting bars 48 may extend from any one of the stub portions 42, 44, 46. Thus, the ring structure 32 need not be directly connected to the chip mounting pad 18 and the leads 22, but may none the less be connected via connecting bars to other structures of the frame 14. Further, the temporary connecting bars 48, 50 are not required to connect to the chip mounting pad 18 or the leads 22 as shown, but may be attached to other structures connected to the frame 14, such as the tie bars 20 or the dambars 28. While the ring structure 32 and temporary connecting bars 48, 50 are shown to have a different hatch patterns from that of the chip mounting pad 18, the tie bars 20, and the leads 22 it is understood that such structures are formed from a contiguous sheet of material of the lead frame 10, as the such different hatch patterns are only utilized for ease of identification.

The lead frame 10 may be manufactured from a sheet of metal material, such as copper (Cu), copper alloy (Cu Alloy), alloy 37 (nickel (Ni) of 37%, iron (Fe) of 55%). The lead frame 10 may have a uniform thickness of about 0.25 millimeters (about 10 mils). Such thickness is exemplary only, and can be varied according to the application field. Moreover, it is contemplated that the lead frame 10 need not have a uniform thickness. For example, selective portions of such components, such as the peripheral portion of the chip mounting pad 18 may be undercut via etching for improved encapsulant adhesion during later stages of the fabrication of the semiconductor package 12.

Finally, the lead frame 10 may be plated with a conductive metal, such as gold (Au), silver (Ag), nickel (Ni), palladium (Pd), or alloys thereof, as a surface preparation to facilitate bonding as discussed below.

Figure 3:
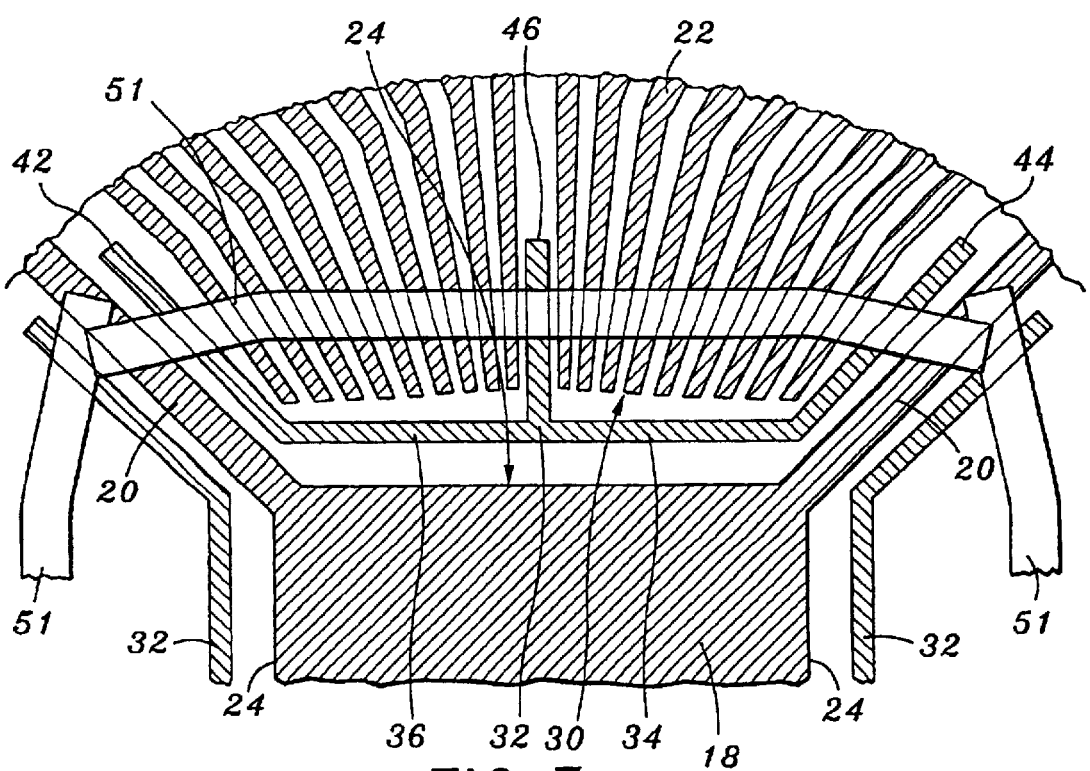
FIG. 3 is the region of the lead frame as shown in FIG. 2 with the ring structure formed from the lead frame with the removal of connecting bars, a nonconductive connector the ring structure and leads, and a semiconductor chip.

Having thus initially provided the above described lead frame 10, the method of fabrication further provides for attachment of a nonconductive connector 51 as shown in FIG. 3. As will be discussed further below, the leads 22 are later formed to each include distal ends 68 opposite the inner ends 30. Moreover, transition sections 92 are formed between the inner and distal ends 30, 68. The nonconductive connector 51 is attached to the distal ends 68 of the leads 22 and the stub portions 42, 44, 46 for maintaining the ring structure 32 in fixed relationship to the chip mounting pad 18 and the leads 22. In particular, the nonconductive connector 51 is attached to distal end top surfaces 82 of the distal ends 68 of the leads 22 and the top surfaces of stub portion distal sections 58. For additional support, the nonconductive connector 51 may be further attached to the tie bars 20. The nonconductive connector 51 may be adhesive tape, such as a conventional polyimide-based tape. Dedicated equipment may be utilized which punches out a piece of tape from a reel in the desired pattern using a custom tape punch tool. The nonconductive connector 51 is then placed upon the lead frame 10, and in particular across the stub portions 42, 44, 46, using an automated pick and place apparatus.

The method further provides for removing the temporary connecting bars 48, 50. Having removed the temporary connecting bars 48, 50, the ring structure 32 is contemplated to be electrically isolated in nature from the chip mounting pad 18, the leads 22, the tie bars 20, and any other portion of the frame 14. The removal of the temporary connecting bars 48, 50 may be accomplished via a punch process wherein a standard punch and die set are configured to remove each of the connecting bars 48, 50. The nonconductive connector 51 is sized and configured to provided sufficient stabilization to maintain the ring structure 32 in a fixed relationship with the chip mounting pad 18 and the leads 22 during this removal process of the temporary connecting bars 48, 50.

Figure 4:
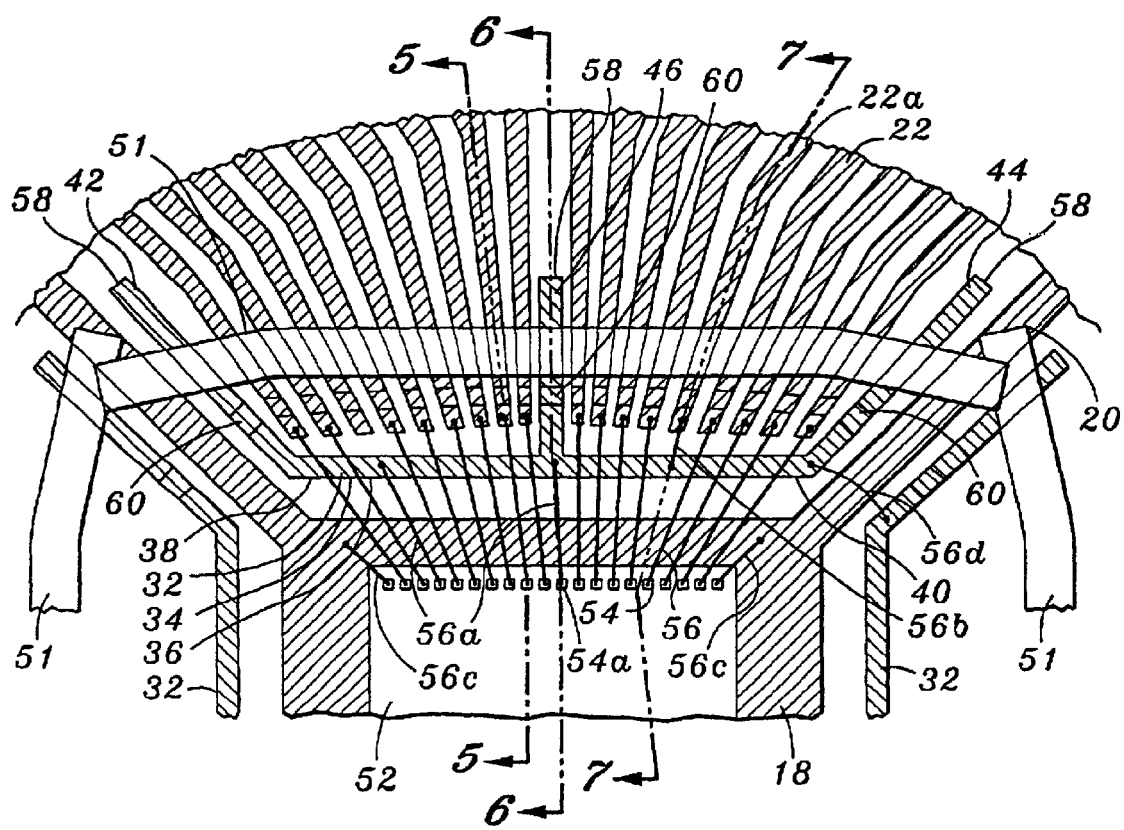
FIG. 4 is the region of the lead frame as shown in FIG. 3 with electrical connections among the semiconductor chip, the ring structure, and the leads.

Referring now to FIG. 4, portions of the frame 12 are downset such as through a die press operation. In particular, the inner ends 30 of the leads 22 and the main body portion 34 of the ring structure 32 are formed to be vertically raised or off-set from those other portions of the frame 12. Such downsetting results in each inner end 30 being vertically downset or offset with respect to each respective distal end 68. The transition sections 92 of the leads 22 are thus formed between the inner ends 30 and the distal ends 68 (as additionally depicted in the completed semiconductor package 12 of FIGS. 5 and 7, as seen respectively along axes 5—5 and 7—7 of FIG. 4).

In addition, the downsetting results in the stub portions 42, 44, 46 of the ring structure 32 each including the stub portion distal section 58 vertically downset or offset from the main body portion 34. Stub portion transition sections 60 are thus formed between the stub portion distal sections 58 and the main body portion 34 (as additionally depicted in the completed semiconductor package 12 of FIG. 6, as seen along axis 6—6 of FIG. 4). The location and placement of the nonconductive connector 51 is such that the nonconductive connector 51 extends across the distal ends 68 of the leads 22, the stub portion distal sections 58 and the tie bars 20.

Each inner end 30 may be vertically downset with respect to each respective distal end 68 a distance approximately equal to a thickness of the leads 22. The inner ends 30 include the inner end top surfaces 78 and opposing inner end bottom surfaces 80, and the distal ends 68 include distal end top surfaces 82 and opposing distal end bottom surfaces or signal lands 72. As mentioned above, the lead frame 10 may be formed of a sheet of material having a thickness of about 0.25 millimeters (about 10 mils). As such the leads 22 may be bent during the downsetting process such that the inner end top surfaces 78 are offset from the distal end top surfaces 82 by about 0.25 millimeters. Stated otherwise, the inner end bottom surfaces 80 may be aligned with the distal end top surfaces 82. It is understood that such offset distance is exemplary.

It is contemplated that the downsetting of the leads 22 may be effectuated such that the inner ends 30 are aligned with other portions of the semiconductor package 12. In this regard, the completed semiconductor package 12 includes a semiconductor chip 52 as discussed below. Such semiconductor chip 52 includes a chip top surface 94. The semiconductor chip 52 is mounted upon the chip mounting pad 18. The inner end top surfaces 78 may be aligned with (i.e., coplanar to) the chip top surface 94. Moreover, as the ring structure 32 may be downset along with the leads 22, the inner end top surfaces 78 may be aligned with (i.e., coplanar to) an intermediate section top surface 84 of the intermediate section 36 of the ring structure 32. Thus, the intermediate section 36 may include an intermediate section bottom surface 86 aligned with the inner end bottom surfaces 80.

Additionally, the angular disposition of the transition sections 92 may be varied. For example, the transition sections 92 may be disposed at an angle in the range of thirty degrees to forty-five degrees with respect to the distal ends 68. It is understood that while the transition sections 92 are shown to have well defined angulations with respect to the contiguously formed inner and distal ends 30, 68, the transitions between the transition sections 92 and the inner and distal ends 30, 92 may be more curved in nature than as depicted. Moreover, the lengths of the inner ends 30, transition sections 92 and distal ends 68 may be varied as well.

The method next provides for attaching a semiconductor chip 52 to the chip top surface 94 of the chip mounting pad 18. As mentioned above, the inner end top surfaces 78 may be vertically aligned with the chip top surface 94. As such, the inner ends 30 in this embodiment would be offset or downset by a thickness of the semiconductor chip 52 and any thickness associated with a bonding layer between the semiconductor chip 52 and a mounting pad top surface 74. Such attachment or bonding may be accomplished through the use of an epoxy, an adhesive film, or adhesive tape. The semiconductor chip 52 includes a plurality of input/output pads 54 disposed on the chip top surface 94.

The method further provides for electrically connecting the semiconductor chip 52 to the ring structure 32. In this regard, selected ones of the input/output pads 54, such as 54a, are electrically connected to the ring structure 32. In turn, the ring structure 32 is electrically connected to an inner end 30 of at least one of the leads 22, such as lead 22a. Such electrical connections may be facilitated through the use of conductive wires 56 (exemplary ones depicted). The conductive wires 56 may be formed of gold, copper, or aluminum wires for example. Moreover, common wire bonding techniques may be employed such as Au ball bonding. Thus, the conductive wire 56a is used to electrically connect the input/output pad 54a to the ring structure 32 (as additionally depicted in the completed semiconductor package 12 of FIG. 6, as seen along axis 6—6 of FIG. 4).

Figure 7:
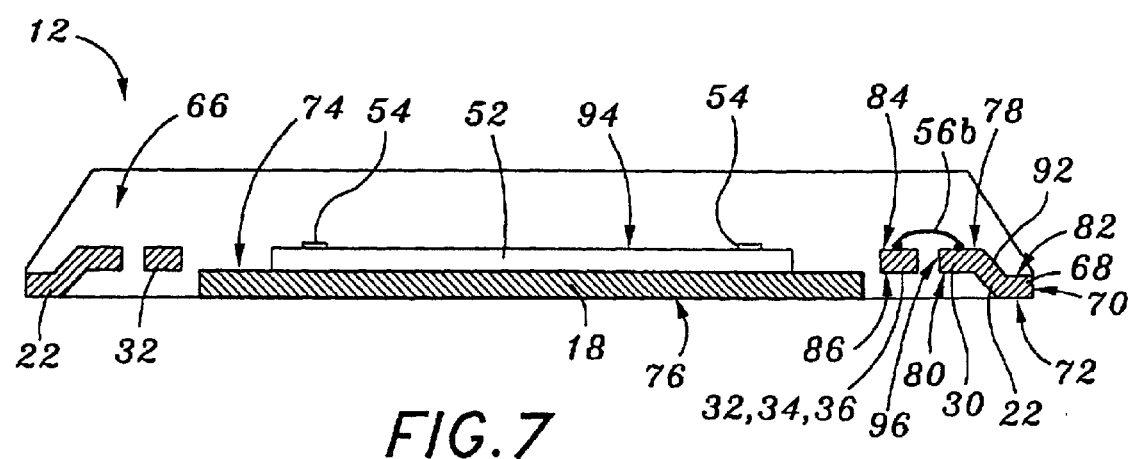
FIG. 7 is a cross sectional view of a completed semiconductor package as seen along axis 7—7 of FIG. 4.

Further, the conductive wire 56b is used to electrically connect the ring structure 32 to the inner end top surface 78 of lead 22a (as additionally depicted in the completed semiconductor package 12 of FIG. 7, as seen along axis 7—7 of FIG. 4). The forgoing configuration advantageously allows the ring structure 32 to share a common electrical potential as the connected lead 22a. For example, the lead 22a may be utilized for connection to an external power source (not shown). Connection of the lead 22a to the ring structure 32 is achieved through the connecting wire 56b. This in turn results in the entire ring structure 32 being conveniently available for connection by any of the input/output pads 54, such as pads 54a, through the connecting wires 56a. Thus, a single lead, lead 22a, may be utilized to power two of the input/output pads 54, thereby avoiding one-to-one dedication of leads 22 for each of the input/output pads 54. In an alternate exemplary usage, the lead 22a may be connected to electrical ground, thereby providing the ring structure 32 as a convenient ground source. In this embodiment, because the main body portion 34 of the ring structure 32 is similarly downset as the inner ends 30, this allows for ease of the electrical connection therebetween with the connecting wire 56b.

Figure 5:
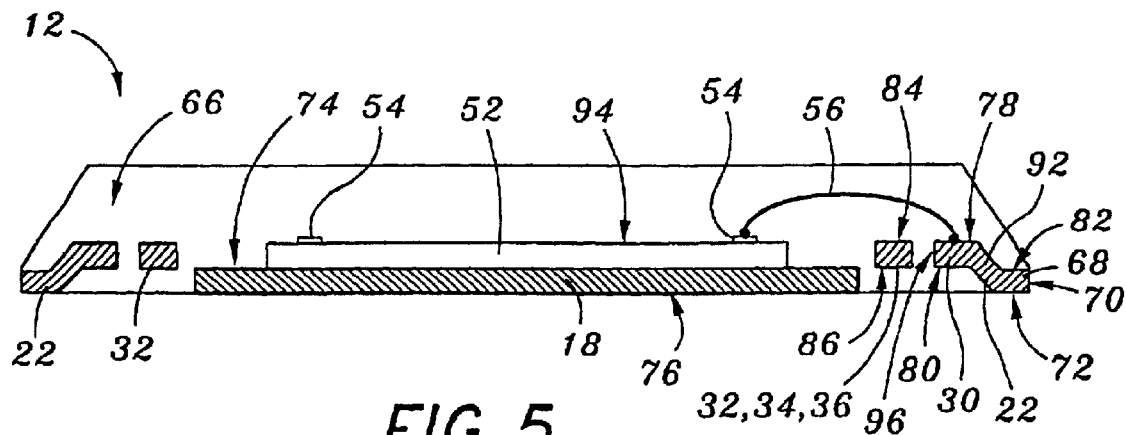
FIG. 5 is a cross sectional view of a completed semiconductor package including the lead having a downset inner end as seen along axis 5—5 of FIG. 4.

Referring additionally to the completed semiconductor package 12 of FIG. 5, as seen along axis 5—5 of FIG. 4, other ones of the input/output pads 54 of the semiconductor chip 52 are directly electrically connected other respective ones of the leads 22 through the connecting wires 56. In particular, connection is made to the inner end top surface 78. In this embodiment, because the chip top surface 94 is aligned with the inner end top surface 78, this allows for ease of the electrical connection therebetween with the connecting wire 56.

Thus, the electrical signals of the semiconductor chip 52 can be transmitted to a printed circuit board (not shown) via the conductive wires 56 and the leads 22. The conductive wires 56 and the leads 22 may also be used to facilitate the transmission of electrical signals from the printed circuit board to the semiconductor chip 52.

In addition, the selected ones of the input/output pads 54, such pads 54b, may be electrically connected via conductive wires 56c to the chip mounting pad 18. It is contemplated that during operation of the semiconductor package 12, the chip mounting pad 18 may be electrically grounded by connection of a given one of the tie bars 20 to electrical ground.

It is contemplated that proscribed portions of the frame 12 are subsequently encapsulated. In this regard, the semiconductor chip 52, the chip mounting pad 18, the conductive wires 56, the tie bars 20, the leads 22 (including the inner ends 30) and the ring structure 32 are sealed with a sealing material, such as an epoxy molding compound. The area sealed with the sealing material is defined as a package body or sealing part 66. Advantageously, the downset or offset nature of the inner ends 30 of the leads 22 allows for the sealing part 66 to encompass that volume under the inner end bottom surface 82 for enhanced bonding of the leads 22.

In the embodiment shown, the chip mounting pad 18 is shown as not being downset and the resulting semiconductor package 12 is formed with the chip mounting pad 8 having an exposed mounting pad bottom surface 76. This is contemplated to have certain heat dissipation advantages. However, it is understood that the chip mounting pad 18 may be downset with respect to other portions of the lead frame 10 with the tie bars 20 having transitions sections (not shown). In this regard, the mounting pad bottom surface 76 may be surrounded with sealing material.

Finally, the semiconductor package 12 is formed with the completion of a singulation process or step. In this respect, in the lead frame 10, the leads 22 are singulated to separate the semiconductor package 12 from the frame 14. Referring additionally to the completed semiconductor package 12 of FIGS. 5 and 7, as respectively seen along axes 5—5 and 7—7 of FIG. 4, this results in the leads 22 including the distal ends 68 opposite the inner ends 30. The distal ends 68 each include an exposed end surface 70 and an exposed bottom surface or signal land 72. In this regard, the signal lands 72 are disposed about the periphery of the bottom surface of the semiconductor package 12. The semiconductor package 12 may be utilized in electrical communication with the printed circuit board by soldering the signal lands 72 directly to the printed circuit board. Similarly, the stub portion distal sections 58 may include exposed distal section bottom surfaces 90 for solder connection to the printed circuit board.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor package comprising:
    a chip mounting pad having a peripheral edge;
    a semiconductor chip attached to the chip mounting pad;
    a plurality of leads, each lead including an inner end and an opposing distal end, each inner end being disposed adjacent the peripheral edge in spaced relation thereto and vertically downset with respect to each respective distal end; and
    at least one isolated ring structure disposed along the peripheral edge between the peripheral edge and all of the inner ends of the leads in spaced relation thereto, the ring structure being electrically connected to the semiconductor chip and the inner end of at least one of the leads.

2. The semiconductor package of claim 1 wherein the inner end of each of the leads is vertically downset with respect to the distal end thereof a distance approximately equal to a thickness of the leads.

3. The semiconductor package of claim 1 wherein:
the semiconductor chip includes a chip top surface;
the inner ends each include an inner end top surface; and
the inner end top surfaces are aligned with the chip top surface.

4. The semiconductor package of claim 1 wherein:
the ring structure includes a ring top surface;
the inner ends each include an inner end top surface; and
the inner end top surfaces are aligned with the ring top surface.

5. The semiconductor package of claim 1 wherein each of the leads further includes a lead transition section disposed between the inner and distal ends thereof.

6. The semiconductor package of claim 5 wherein the lead transition section is angularly disposed with respect to the distal end.

7. The semiconductor package of claim 1 further comprising a sealing part encapsulating the inner ends of the leads.

8. A lead frame comprising:
a frame defining a central opening;
a chip mounting pad disposed within the opening and attached to the frame, the chip mounting pad defining a peripheral edge;
a plurality of leads attached to the frame and extending within the opening toward the chip mounting pad, each of the leads including an inner end disposed in spaced relation to and vertically downset from the chip mounting pad; and
at least one isolated ring structure extending between the peripheral edge of the chip mounting pad and all of the inner ends of the leads in spaced relation thereto.

9. The leadframe of claim 8 wherein:
each of the leads has a lead thickness; and
the inner end of each of the leads is vertically downset from the chip mounting pad at a distance approximately equal to the lead thickness.

10. The leadframe of claim 8 wherein:
the ring structure includes a ring top surface;
the inner end of each of the leads includes an inner end top surface; and
the inner end top surface of each of the leads is aligned with the ring top surface.

11. The semiconductor package of claim 8 wherein each of the leads includes a lead transition section extending angularly between the inner end and the frame.

12. The leadframe of claim 8 further comprising at least one temporary connecting bar connecting the ring structure to the chip mounting pad.

13. The leadframe of claim 8 further in combination with a non-conductive connector attached to the ring structure and at least one of the leads for maintaining the ring structure in fixed relation to the chip mounting pad and the leads.

14. A semiconductor package comprising:
a chip mounting pad defining a peripheral edge;
a semiconductor chip attached to the chip mounting pad and having a plurality of input/output pads;
a plurality of leads, each of the leads including an inner end and an opposed distal end, the inner end of each of the leads being disposed adjacent the peripheral edge in spaced relation thereto and vertically downset relative to the distal end; and
a means disposed along the peripheral edge between the peripheral edge and all of the inner ends of the leads for allowing at least two of the input/output pads of the semiconductor chip to be electrically connected to a common one of the leads.

15. The semiconductor package of claim 14 wherein the means comprises at least one isolated ring structure which is electrically connected to at least two of the input/output pads of the semiconductor chip and to one of the leads.

16. The semiconductor package of claim 15 wherein:
the ring structure includes a top ring surface;
the inner end of each of the leads includes an inner end top surface; and
the inner end top surface of each of the leads is aligned with the ring top surface.

17. The semiconductor package of claim 15 wherein:
the semiconductor chip includes a chip top surface;
the inner end of each of the leads includes an inner end top surface; and
the inner end top surface of each of the leads is aligned with the chip top surface.

18. The semiconductor package of claim 1 wherein each inner end of the plurality of leads is generally spaced an equal distance from the peripheral edge.

19. The semiconductor package of claim 1 wherein each inner end of the plurality of leads is positioned outside the at least one isolated ring structure such that there are no lead structures between the at least one isolated ring structure and the peripheral edge.

20. The semiconductor package of claim 1 wherein the at least one isolated ring structure comprises a main body portion oriented substantially parallel and adjacent to the peripheral edge.

21. The semiconductor package of claim 20 wherein the at least one isolated ring structure has a pair of opposing end sections and further comprises a stub portion attached to each end section.

22. The semiconductor package of claim 21 wherein the stub portion is oriented substantially parallel along side one of a plurality of tie bars connected to the peripheral edge of the chip mounting pad.

23. The semiconductor package of claim 8 wherein each inner end of the plurality of leads is generally spaced an equal distance from the peripheral edge.

24. The semiconductor package of claim 8 wherein each inner end of the plurality of leads is positioned outside the at least one isolated ring structure such that there are no lead structures between the at least one isolated ring structure and the peripheral edge.

25. The semiconductor package of claim 8 wherein the at least one isolated ring structure comprises a main body portion oriented substantially parallel and adjacent to the peripheral edge.

26. The semiconductor package of claim 15 wherein the at least one isolated ring structure has a pair of opposing end sections and further comprises a stub portion attached to each end section.

27. The semiconductor package of claim 26 wherein the stub portion is oriented substantially parallel along side one of a plurality of tie bars connected to the peripheral edge of the chip mounting pad.

* * * * *